US007868630B2

(12) United States Patent
Caldwell et al.

(10) Patent No.: US 7,868,630 B2
(45) Date of Patent: Jan. 11, 2011

(54) INTEGRATED LIGHT CONDITIONING DEVICES ON A PROBE CARD FOR TESTING IMAGING DEVICES, AND METHODS OF FABRICATING SAME

(75) Inventors: John Caldwell, Meridian, ID (US); Randy Cleverly, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/768,287

(22) Filed: Jun. 26, 2007

(65) Prior Publication Data
US 2009/0002001 A1   Jan. 1, 2009

(51) Int. Cl.
*G01R 31/302* (2006.01)
(52) U.S. Cl. ...................................... 324/752
(58) Field of Classification Search ......... 324/752–754, 324/761, 765, 158.1; 356/237.1, 239.2; 250/492.1, 250/492.2
See application file for complete search history.

(56) References Cited

U.S. PATENT DOCUMENTS

| | | | | |
|---|---|---|---|---|
| 5,617,131 | A * | 4/1997 | Murano et al. | 347/233 |
| 6,048,750 | A | 4/2000 | Hembree | 438/107 |
| 6,211,960 | B1 | 4/2001 | Hembree | 356/400 |
| 6,239,590 | B1 | 5/2001 | Krivy et al. | 324/158.1 |
| 6,379,982 | B1 | 4/2002 | Ahn et al. | 438/14 |
| 6,419,844 | B1 | 7/2002 | Krivy et al. | 216/2 |
| 6,420,892 | B1 | 7/2002 | Krivy et al. | 324/758 |
| 6,472,239 | B2 | 10/2002 | Hembree et al. | 438/18 |
| 6,600,171 | B1 | 7/2003 | Farnworth et al. | 257/48 |
| 6,614,103 | B1 * | 9/2003 | Durocher et al. | 257/678 |
| 6,646,286 | B1 | 11/2003 | Akram | 257/48 |
| 6,653,208 | B2 | 11/2003 | Ahn et al. | 438/458 |
| 6,670,818 | B1 | 12/2003 | Hembree | 324/758 |
| 6,680,213 | B2 | 1/2004 | Farnworth et al. | 438/15 |
| 6,686,993 | B1 * | 2/2004 | Karpman et al. | 356/237.1 |
| 6,774,651 | B1 | 8/2004 | Hembree | 324/758 |
| 6,790,684 | B2 | 9/2004 | Ahn et al. | 438/14 |
| 6,859,031 | B2 * | 2/2005 | Pakdaman et al. | 324/233 |
| 6,912,778 | B2 | 7/2005 | Ahn et al. | 29/852 |
| 7,042,080 | B2 | 5/2006 | Kirby et al. | 257/692 |
| 7,049,700 | B2 | 5/2006 | Hembree et al. | 257/760 |
| 7,148,715 | B2 | 12/2006 | Akram et al. | 324/765 |
| 7,168,163 | B2 | 1/2007 | Forbes et al. | 29/846 |
| 7,218,130 | B2 | 5/2007 | Miller et al. | 324/762 |
| 7,253,443 | B2 * | 8/2007 | Yoshida et al. | 257/80 |
| 7,554,755 | B2 * | 6/2009 | Tung | 359/819 |
| 2006/0103378 | A1 * | 5/2006 | Pakdaman et al. | 324/228 |
| 2006/0214673 | A1 * | 9/2006 | Tamai | 324/753 |
| 2006/0228825 | A1 | 10/2006 | Hembree | 438/51 |
| 2006/0255826 | A1 | 11/2006 | Akram et al. | 324/765 |
| 2007/0268483 | A1 * | 11/2007 | Yatsugake et al. | 356/237.1 |
| 2008/0136434 | A1 * | 6/2008 | Lu et al. | 324/758 |

* cited by examiner

*Primary Examiner*—Ha Tran T Nguyen
*Assistant Examiner*—Arleen M Vazquez
(74) *Attorney, Agent, or Firm*—Dickstein Shapiro LLP (57) ABSTRACT

A probe card is disclosed which includes a body, at least one housing in the body, the housing having at least one light opening, and at least one light conditioning device in the at least one light opening in the housing. A method of forming a probe card is also disclosed which includes forming an opening in a body of the probe card, positioning a housing having a light opening in the opening in the body of the probe card and positioning at least one light conditioning device in the light opening in the housing.

20 Claims, 7 Drawing Sheets

INTEGRATED LIGHT CONDITIONING DEVICES ON A PROBE CARD FOR TESTING IMAGING DEVICES, AND METHODS OF FABRICATING SAME

BACKGROUND OF THE INVENTION

1. Field of the Invention

The present invention is generally directed to the field of testing integrated circuit devices, and, more particularly, to a probe card with integrated light conditioning devices for testing imaging devices, and methods of fabricating same.

2. Description of the Related Art

The microelectronics industry is highly competitive and microelectronic device manufacturers are very sensitive to quality and cost considerations. Most microelectronic device manufacturers are required to test the performance of each microelectronic device prior to shipping it to a customer. For example, microelectronic imagers are commonly tested by establishing temporary electrical connections between a test system and electrical contacts on each microelectronic imaging die while simultaneously exposing an image sensor on the device to light.

One way of establishing a temporary electrical connection between the test system and the contacts on a microelectronic component employs a probe card carrying a plurality of probe pins. The probe pins are typically either a length of wire (e.g., cantilevered wire probes) or a relatively complex spring-biased mechanism (e.g., pogo pins). The probe pins are connected to the probe card and arranged in a predetermined array for use with a specific microelectronic component configuration. For example, when testing a microelectronic imager with a conventional probe card (whether it be a cantilevered wire probe card, a pogo pin probe card or another design), the probe card is positioned proximate to the front side of the imaging die to be tested. The probe card and the imaging die are aligned with each other in an effort to precisely align each of the probe pins of the probe card with a corresponding electrical contact of the front side of the imaging die.

One problem with testing imaging dies at the wafer level is that it is difficult to expose an image sensor to light while simultaneously aligning the probe pins or the body of the probe card with the corresponding electrical contacts on the front side of the imaging die. For example, because the probe card is positioned over the image sensor to contact the front side bond-pads on the die, the probe card must have a plurality of holes or apertures through which light can pass. This limits wafer-level testing methods because of the physical constraints of probe card structures and the limited testing area available on the wafer. Further, the probe card and/or probe pins positioned proximate (but not over) the image sensor may also interfere with the light directed to the image sensor (e.g., shadowing, reflections). These limitations result in the ability to test only a fraction of the imaging dies on a wafer of imaging dies as compared to the number of other types of dies that can be tested in non-imaging applications (e.g., memory, processors, etc.). Typically, only four CMOS imaging dies can be tested simultaneously on a wafer, compared to 128 DRAM dies using the same equipment. Accordingly, there is a need to improve the efficiency and throughput for testing imaging dies.

Traditional probe card structures for testing imaging devices are manufactured by a process employed in manufacturing printed circuit boards. The light openings formed in such traditional probe card structures are formed by traditional mechanical means, such as drilling. As imager devices become more sophisticated, the traditional structure of such probe cards can be a disadvantage as it relates to testing of advanced imager devices. Moreover, the prior art probe cards may limit their effectiveness or efficiency as it relates to future device generations, as such devices continue to be reduced in size.

BRIEF DESCRIPTION OF THE DRAWINGS

The present subject matter may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments are described below. In the interest of clarity, not all features of an actual implementation are described in this specification. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

The present subject matter will now be described with reference to the attached figures. Various regions and structures of a probe card, an imager device, and an associated system for testing such devices are schematically depicted in the drawings. For purposes of clarity and explanation, the relative sizes of the various features depicted in the drawings may be exaggerated or reduced as compared to the size of those features or structures on real-world devices and systems. Nevertheless, the attached drawings are included to describe and explain illustrative examples of the present subject matter.

In general, the subject matter disclosed herein is directed to a novel probe card for testing imager-type integrated circuit devices, methods of fabricating such probe cards, testing systems incorporating such probe cards, and testing imager devices using such probe cards. As will be recognized by those skilled in the art after a complete reading of the present application, the subject matter disclosed herein may be employed with testing any of a variety of different microelectronic imager devices, e.g., CMOS-based imagers. Thus, the present disclosure should not be considered as limited to use with any particular type of imager device. Additionally, those skilled in the art will recognize that other terms may be employed to describe the general nature of the probe card described herein, e.g., test card, probe interposer, etc. For ease of reference, the term probe card will be used throughout the specification.

Figure 1A:
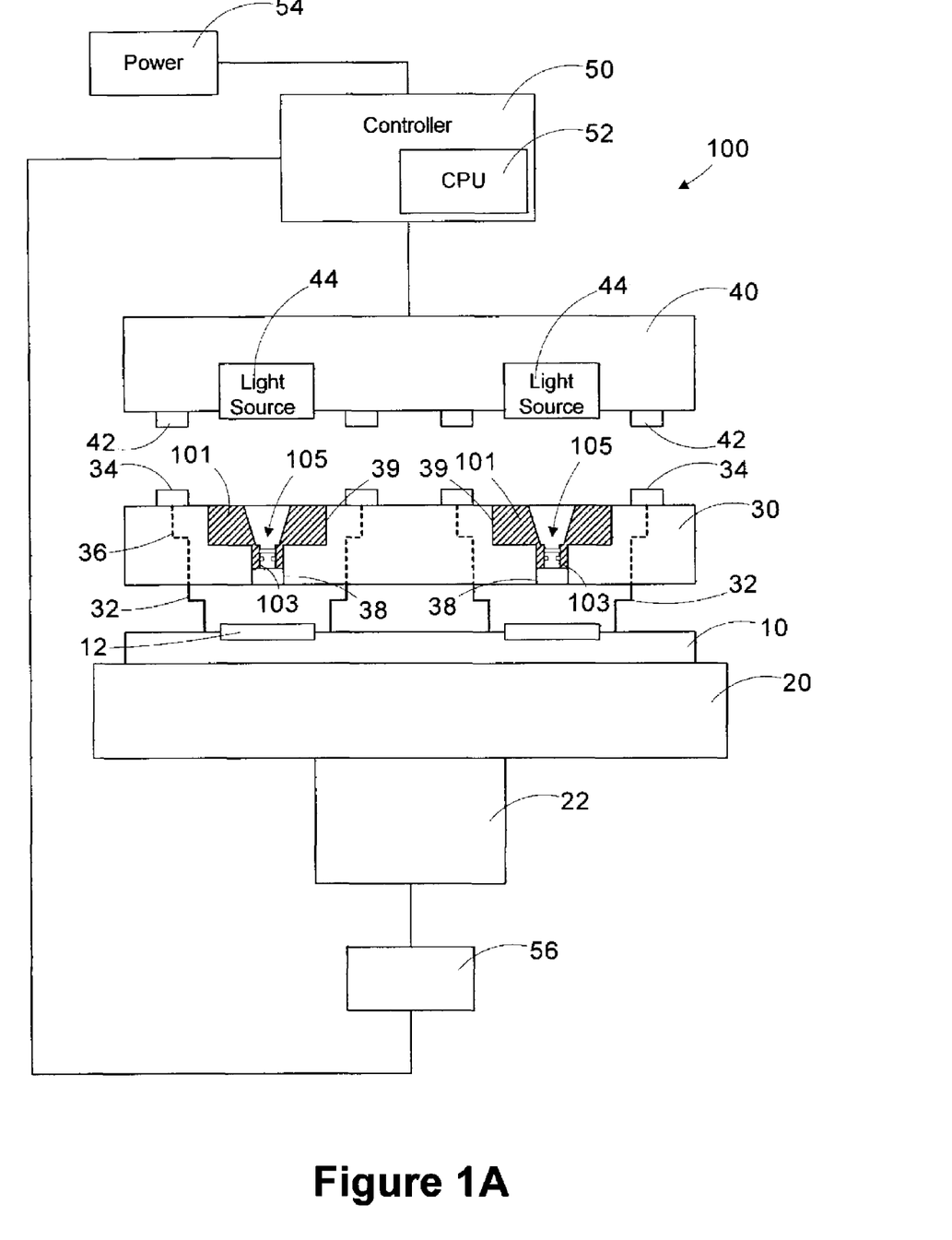
FIGS. 1A-1B are various views of an illustrative embodiment of a system disclosed herein.
Figure 1B:
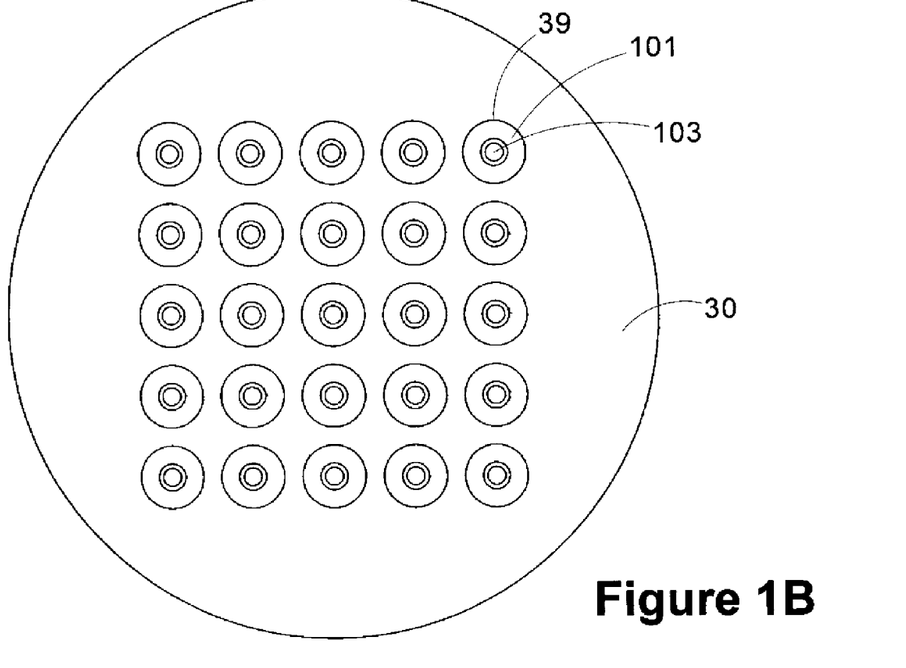

FIGS. 1A-1B schematically depict one illustrative test system 100 disclosed herein. Of course, all operational details of such a system are not shown or described herein so as to not obscure the present invention and because such details are well known to those skilled in the art. In general, the system 100 comprises a substrate 10 under test, a support structure 20, a probe card 30, a test head 40 and a controller 50.

The substrate 10 comprises a plurality of imager devices 12 that are to be tested using the test system 100. As indicated previously, the imager devices 12 are intended to be representative of any type of microelectronic imaging device that may be manufactured using any technique. In one illustrative embodiment, the imager devices 12 are CMOS imager devices. Additionally, it should be understood that the schematically depicted imager device 12 may be designed to perform any desired function. For convenience, only two of the illustrative imager devices 12 are depicted on the substrate 10. In practice, hundreds of such imager devices 12 may be formed on a single substrate 10.

The support structure 20 is provided to position and support the substrate 10 during testing operations. The support structure 20 may be of traditional design. A schematically depicted actuator 22 may be employed to move the support structure 20 in the x-y direction so as to properly position the imager devices 12 at a desired location. The support structure 20 may also include an adjustable mechanism (not shown), e.g., screws, to finely control the vertical separation between the substrate 10 and the probe card 30.

The probe card 30 comprises a body or structure that includes a plurality of probe pins 32 and a plurality of test contacts 34 formed on the upper surface of the probe card 30. The probe pins 32 are electrically connected to the test contact 34 by electrical circuitry 36 formed within the probe card 30. The probe card 30 further comprises light openings 38 to allow light from a light source to be projected onto the imager devices 12 positioned underneath the light opening 38. In the depicted embodiment, the probe pins 32 are depicted as cantilevered structures. However, after a complete reading of the present application, those skilled in the art will recognize that the probe pins 32 may be of any type or structure, e.g., pogo-pins, etc. Thus, the present invention should not be considered as limited to any particular type or structure of probe pin 32.

The test head 40 comprises a plurality of head contacts 42 and a plurality of light sources 44. The head contacts 42 are adapted to electrically contact the test contacts 34 to thereby establish an electrically conductive path between the test head 40 and the probe card 30. Individual light sources 44 are schematically depicted in FIG. 1A. In practice, there may only be a single light source. Additionally, in the schematically depicted embodiment shown in FIG. 1, the light sources 44 are positioned within cavities defined in the test head 40. Those skilled in the art will recognize that such details are provided by way of example only and that such construction details may vary widely depending upon the particular test system employed. The light source 44 is adapted to generate any type of light necessary to irradiate the imager devices 12 to properly test such devices. In one illustrative embodiment, the light sources 44 generate a broad spectrum light when testing CMOS imager devices. Electrical connections to the head contacts 42 and the light sources 44 are provided by internal circuitry (not shown) formed within the test head 40 using traditional techniques.

The controller 50 comprises a programmable processor 52 that is positioned to control the basic operations of the system 100. The controller 50 also controls a power supply 54 that is used to supply power to the various components of the system 100. A separate actuator controller 56 may be employed to control movement of the support structure 20. In general, the controller 50 may be employed to activate the light sources 44 so as to irradiate the imager devices 12 under test, and to generate and transmit any desired test signals to the imager devices 12 via the probe pins 32. Such testing methods and protocols may vary depending upon the particular imager device 12 under test, all of which are well known to those skilled in the art. Additionally, the system 100 may be employed to test imager devices 12 one at a time or in groups.

In FIGS. 1A-1B, the probe card 30 comprises a plurality of individual housings 101 positioned in openings 39 formed in the probe card 30. The housings 101 have an opening 103 adapted to have one or more light conditioning devices 105 positioned therein. The number, size, shape and positioning of the housings 101 may vary depending upon the particular application. FIG. 1B is a top view of one illustrative example of a probe card 30 as described herein. As shown therein, the probe card 30 may have twenty-five such individual housings 101 positioned therein. Note that, in FIG. 1A, only two of the illustrative housings are shown so as not to obscure the present subject matter. In the example depicted in FIG. 1A, the individual housings 101 are depicted as having a generally cylindrical configuration, but any other desired shapes may be employed.

Figure 2A:
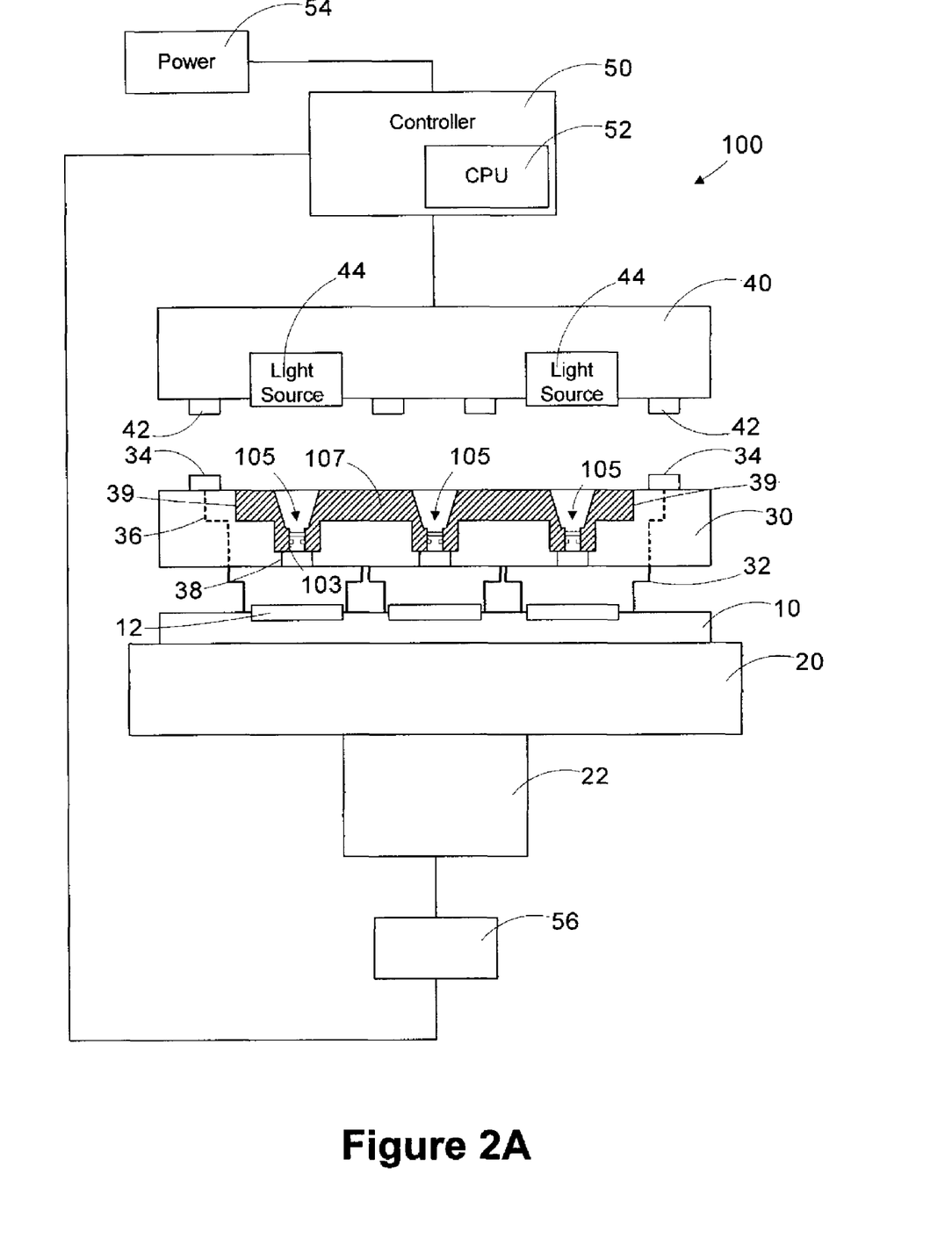
FIGS. 2A-2B are various views of another illustrative embodiment of a system disclosed herein.
Figure 2B:
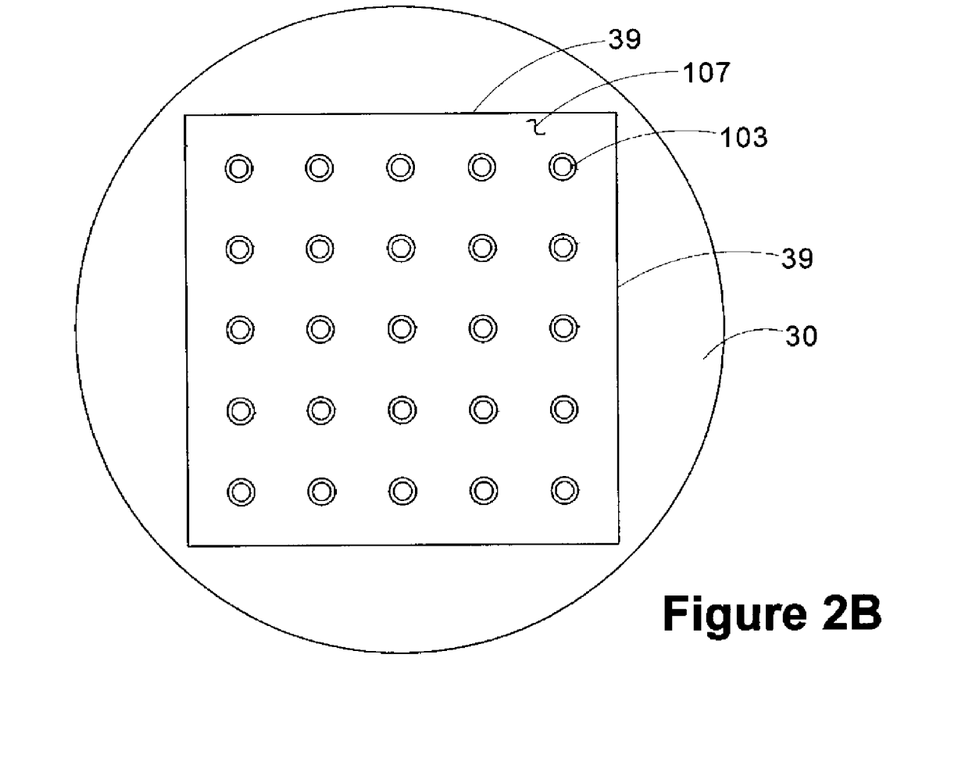

FIGS. 2A-2B depict another illustrative embodiment of a probe card 30 disclosed herein. As shown therein, the probe card 30 comprises a housing 107 that is comprised of multiple light openings 103. In the example depicted in FIG. 2B, the housing 107 has a generally square configuration and the openings 103 have a generally circular configuration. As before, the shape or configuration of the housing 107 and/or the openings 103 may be varied to any desired shape, e.g., circular, rectangular, etc. In FIG. 2A, only three of the illustrative openings 103 are shown so as not to obscure the present subject matter. The openings 103 in the housing 107 are also adapted to have one or more light conditioning devices 105 positioned therein.

The housings, either 101 or 107, are separate components that may be manufactured from a variety of different materials and positioned in the openings 39 formed in the probe card 30. In one illustrative example, the housings 101, 107 may be made from a relatively non-rigid material, e.g., plastic, rubber, epoxy, etc., and it may be made by a variety of techniques, e.g., injection molding, machining, etc. In one illustrative example, the housings 101, 107 may be secured within the opening 39 of the probe card 30 using any of a variety of known techniques, e.g., gluing, an interference or friction fit, a mechanical fastener, etc. The light conditioning devices 105 may be positioned within the housings 101, 107 before or after the housings 101, 107 are positioned in the probe card 30. The light conditioning devices 105 may also be secured within the opening 103 using a variety of known techniques, e.g., an adhesive material, etc.

Figure 3A:
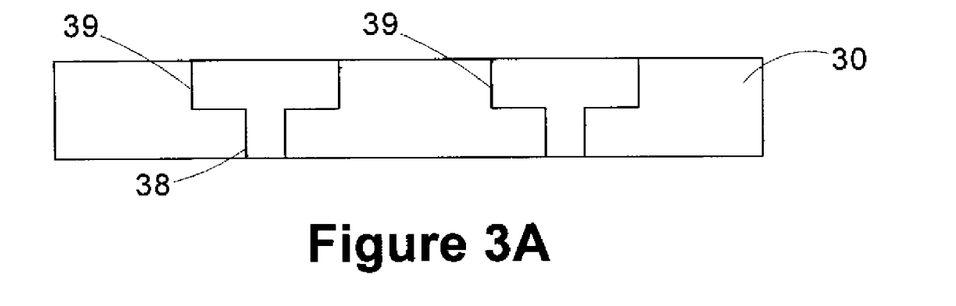
FIGS. 3A-3C depict an illustrative embodiment of a method of forming integrated light conditioning devices in a probe card.
Figure 3B:
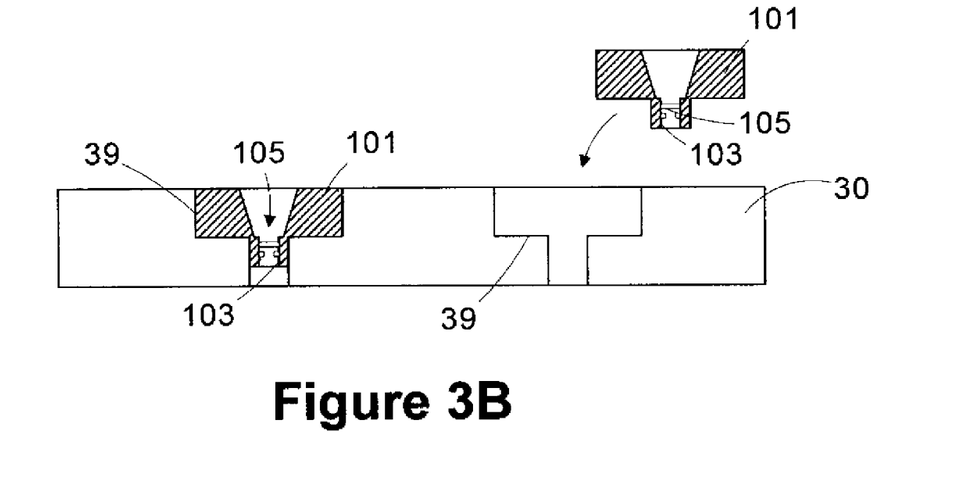
Figure 3C:
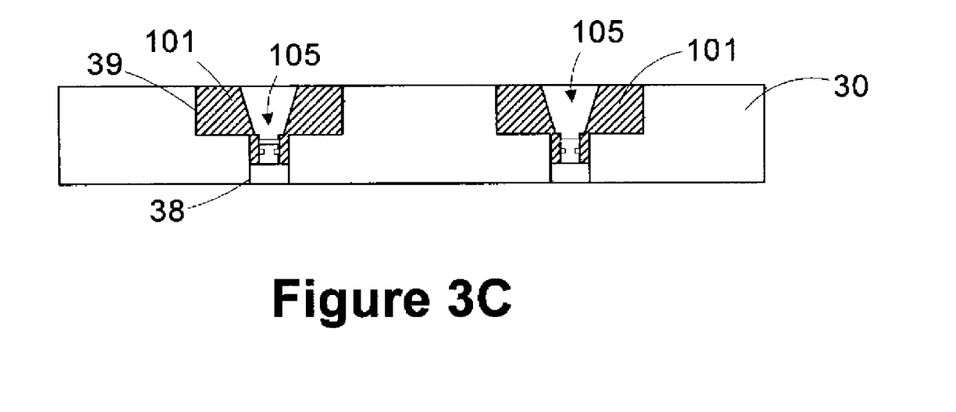

FIGS. 3A-3C depict one illustrative process flow for forming the probe card 30 depicted in FIGS. 1A-1B. As shown in FIG. 3A, a plurality of openings 39 are formed in the probe card 30. The openings 39 may be formed using any of a variety of known techniques employed in forming openings or cutting printed circuit board materials, e.g., drilling, milling, grinding, laser cutting or drilling, etc. The precise techniques employed will depend upon factors such as the size and configuration of the openings 39. Thereafter, as shown in FIG. 3B, the housings 101 are positioned in the openings 39 and secured therein with one or more of the illustrative methods described earlier. FIG. 3B depicts the situation where one of the housings 101 has been positioned in an opening 39 in the probe card 30 while another housing 101 is to be positioned in the probe card 30. In this particular example, the light conditioning devices 105 are depicted as being positioned in the housings 101 prior to positioning the housings 101 in the probe card 30. If desired, the light conditioning devices 105 could be positioned within the housings 101 after the housings 101 are positioned in the probe card 30. FIG. 3C depicts the situation where all of the individual housings 101 have been installed in the probe card 30.

Figure 4A:
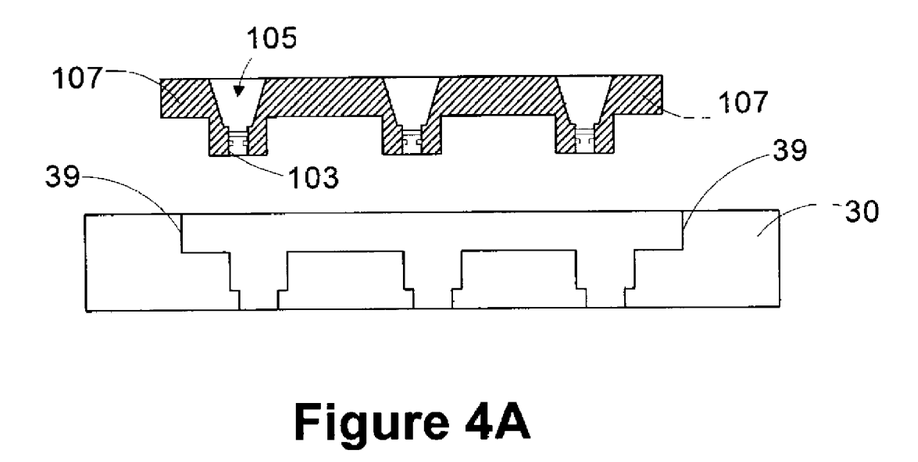
FIGS. 4A-4B depict another illustrative embodiment of a method of forming integrated light conditioning devices in a probe card.
Figure 4B:
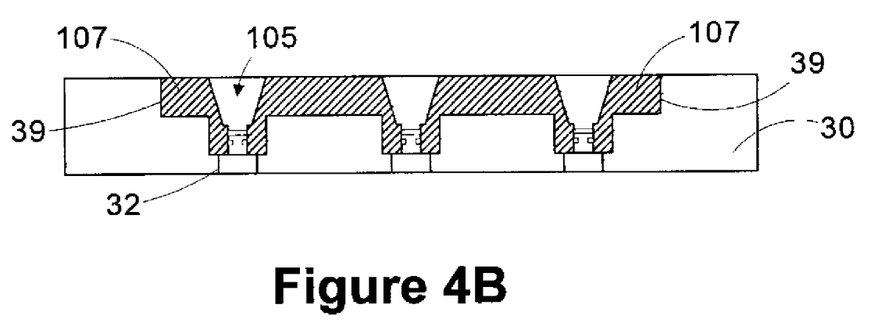

FIGS. 4A-4B depict one illustrative method of forming the probe card 30 depicted in FIGS. 2A-2B. As shown in FIG. 4A, a relatively large opening 39 is formed in the probe card 30 to accommodate the relatively large housing 107. As before, the opening 39 may be formed using any of a variety of known techniques employed in working with printed circuit board materials. Thereafter, as shown in FIG. 4B, the housing 107 is positioned in the opening 39 and secured therein with one or more of the illustrative methods described earlier.

The light conditioning devices 105 described herein may be any type of device that changes, enhances or reduces any characteristic of the light as it passes through such a device. For example, the light conditioning devices 105 may comprise a lens, a diffuser, an aperture, a filter, etc. The exact number, functionality and arrangement of such light conditioning devices 105 may vary depending upon the particular application and the desired characteristics of the light exiting the light opening 38 to irradiate the imager device 12. For example, the final light conditioning device 105 positioned in the opening 103 may be an aperture used to concentrate the light that will irradiate the imager device 12.

The light conditioning housing(s) 101, 107 may be secured in place using a variety of techniques. For example, the housing(s) 101, 107 may be held in place using a variety of techniques such as traditional hardware, e.g., bolts, screws, etc., by positioning or "sandwiching" the housing(s) 101, 107 between adjacent structures, e.g., sandwiched between the probe head keeper plates and the PCB, or between the probe head interposer and probe card stiffener, by providing an interference fit with one or more materials within the probe card stack, by use of an epoxy or other adhesive material, or by employing a semi-rigid mechanism such as a leaf spring. A variety of techniques and alignment features may be employed to align the housing(s) 101, 107 prior to securing the housing(s) 101, 107 in place, e.g., dowel pins, etc. Of course, any combination of the attachment means and alignment features may be employed depending upon the particular application.

Figure 5A:
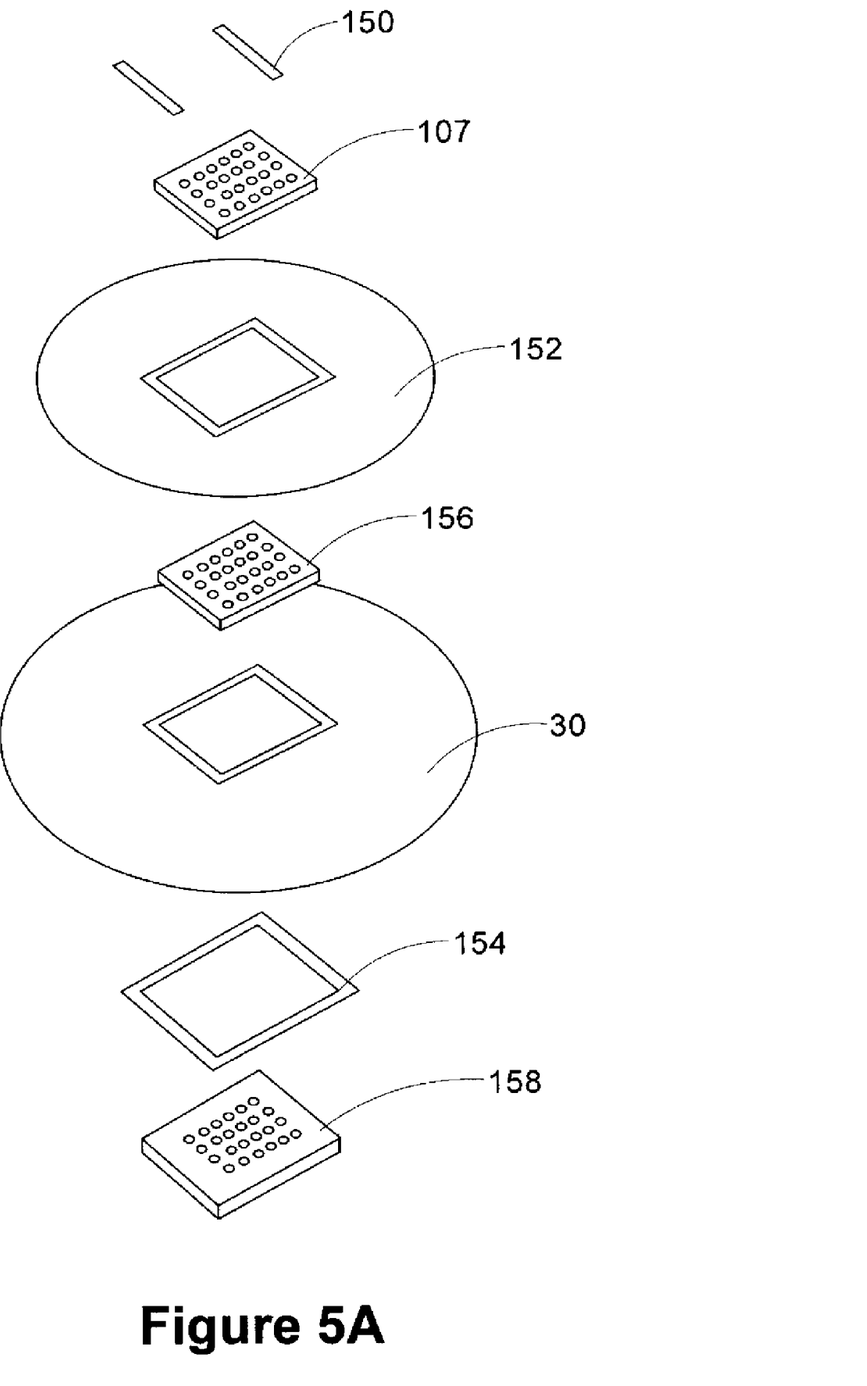
FIGS. 5A-5C depict an illustrative example of securing an illustrative light housing(s) to a probe card.
Figure 5B:
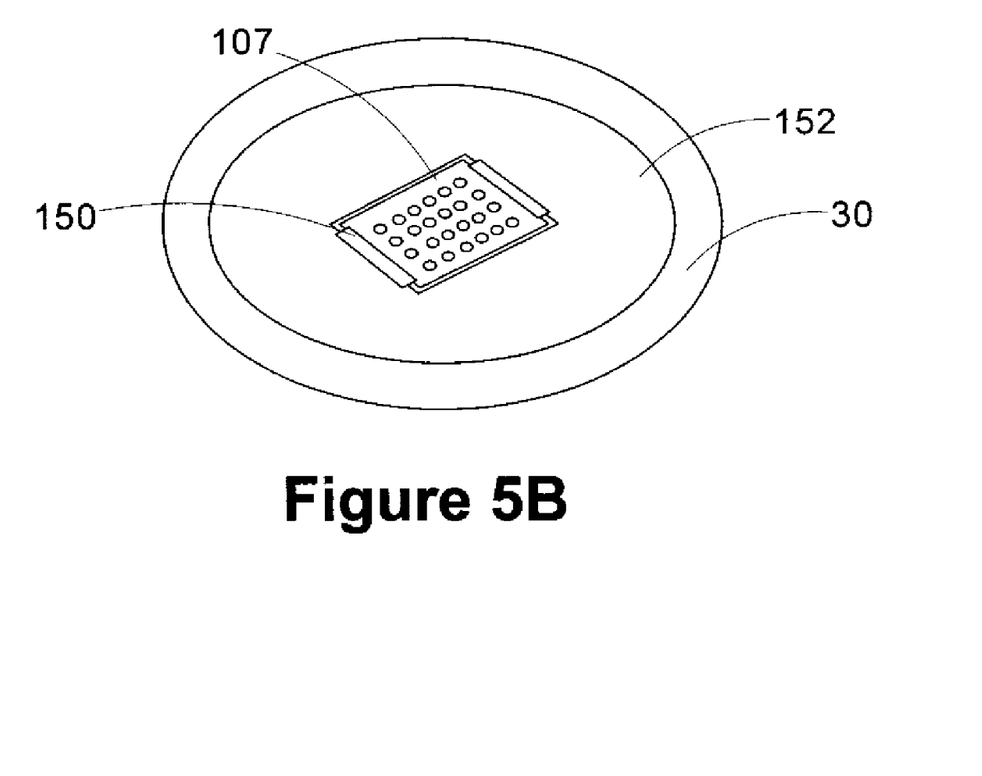
Figure 5C:
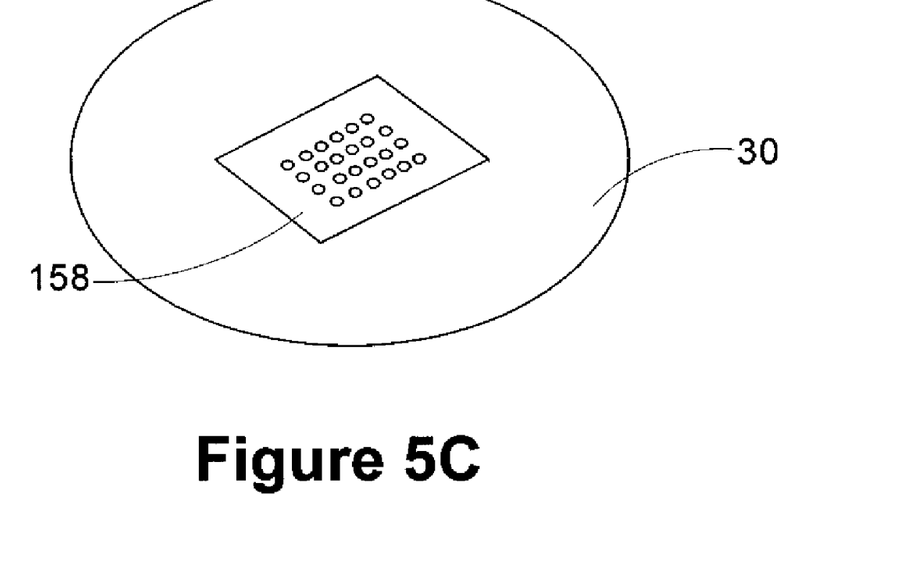

For example, FIGS. 5A-5C depict an illustrative example of a multi-site housing 107 that is held in place by illustrative springs 150. FIG. 5A is an exploded view depicting the hold down springs 150, multi-site housing 107, a top side stiffener 152, a mounting bracket 156, the probe card 30, an interposer 154 and a probe head 158. FIGS. 5B and 5C are, respectively, top and bottom views of the structure shown in FIG. 5A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A probe card, comprising:
   a body including a plurality of light openings;
   at least one housing positioned completely within a housing opening formed partially through the body, the housing opening corresponding to and being substantially aligned with at least one of the plurality of light openings in the body, and the housing having at least one light opening, the at least one light opening in the housing being substantially aligned with the at least one of the plurality of light openings in the body with which the housing opening corresponds; and
   at least one light conditioning device in the at least one light opening in the housing,
   wherein the housing opening is configured such that the at least one housing matingly engages with the housing opening such that sidewalls of the housing and sidewalls of the housing opening are in physical contact along an entirety of the sidewalls of the housing.

2. The probe card of claim 1, wherein the at least one light conditioning device comprises at least one of a lens, a diffuser, an aperture, and a filter.

3. The probe card of claim 1, wherein the body is a printed circuit board.

4. The probe card of claim 3, wherein the at least one housing is positioned in an opening in the printed circuit board.

5. The probe card of claim 1, wherein the at least one housing is made on a non-rigid material.

6. The probe card of claim 1, wherein the at least one housing is made of a rigid material.

7. The probe card of claim 1, wherein the at least one housing comprises:
   a plurality of physically separate housings in the body, each of the plurality of physically separate housings having a light opening; and
   at least one light conditioning device in the light opening of each of the plurality of physically separate housings.

8. A probe card, comprising:
   a body including a plurality of light openings that are arranged in an array, wherein the array includes at least two lines of light openings, each line having a plurality of light openings;
   a monolithic housing positioned completely within a housing opening formed partially through the body, the housing opening being substantially aligned with the plurality of light openings in the body, and the housing comprising a plurality of light openings corresponding to and being substantially aligned with the plurality of light openings in the body; and
   at least one light conditioning device in each of the plurality of light openings in the housing.

9. The probe card of claim 8, wherein the body is a printed circuit board.

10. The probe card of claim 9, wherein the housing is positioned in an opening in the printed circuit board.

11. The probe card of claim 8, wherein the housing is made of a non-rigid material.

12. The probe card of claim 8, wherein the housing is made of a rigid material.

13. A method of forming a probe card, comprising:
- forming a plurality of light openings in a body of the probe card;
- forming a housing opening partially through the body, the housing opening corresponding to and being substantially aligned with at least one of the plurality of light openings in the body;
- positioning a housing completely within the housing opening in the body of the probe card, wherein the housing has at least one light opening, the at least one light opening in the housing being substantially aligned with the at least one of the plurality of light openings in the body with which the housing opening corresponds, and wherein the housing and the housing opening in the body are configured such that the housing matingly engages with the housing opening such that sidewalls of the housing and sidewalls of the housing opening are in physical contact along an entirety of the sidewalls of the housing; and
- positioning at least one light conditioning device in the at least one light opening in the housing.

14. The method of claim 13, wherein the at least one light conditioning device is positioned in the light opening before the housing is positioned in the opening in the body of the probe card.

15. The method of claim 13, wherein the at least one light conditioning device is positioned in the light opening after the housing is positioned in the opening in the body of the probe card.

16. The method of claim 13, further comprising irradiating a device under test with light directed through the at least one light conditioning device in the light opening.

17. A method of forming a probe card, comprising:
- forming a plurality of light openings in a body of the probe card, the plurality of light openings being arranged in an array, wherein the array includes at least two lines of light openings, each line having a plurality of light openings;
- forming a housing opening partially through the body, the housing opening being substantially aligned with the plurality of light openings in the body;
- positioning a monolithic housing completely within the housing opening in the body of the probe card, wherein the housing has a plurality of light openings corresponding to and being substantially aligned with the plurality of light openings in the body; and
- positioning at least one light conditioning device in each of the plurality of light openings in the housing.

18. The method of claim 17, wherein the light conditioning devices are positioned in the light openings before the housing is positioned in the opening in the body of the probe card.

19. The method of claim 17, wherein the light conditioning devices are positioned in the light openings after the housing is positioned in the opening in the body of the probe card.

20. The method of claim 17, further comprising irradiating a device under test with light directed through the at least one light conditioning device in the light opening.

* * * * *

UNITED STATES PATENT AND TRADEMARK OFFICE
CERTIFICATE OF CORRECTION

| | | |
|---|---|---|
| PATENT NO. | : 7,868,630 B2 | Page 1 of 1 |
| APPLICATION NO. | : 11/768287 | |
| DATED | : January 11, 2011 | |
| INVENTOR(S) | : John Caldwell et al. | |

It is certified that error appears in the above-identified patent and that said Letters Patent is hereby corrected as shown below:

IN THE CLAIMS:

In column 6, line 36, in Claim 5, delete "on" and insert -- of --, therefor.

Signed and Sealed this
Fifth Day of April, 2011

David J. Kappos
*Director of the United States Patent and Trademark Office*